US007114116B2

(12) United States Patent
Byrd

(10) Patent No.: US 7,114,116 B2
(45) Date of Patent: Sep. 26, 2006

(54) ACCELERATED GALOIS DATA INTEGRITY CROSSCHECK SYSTEM AND METHOD

(75) Inventor: James Byrd, Long Mount, CO (US)

(73) Assignee: Sun Microsystems, Inc., Santa Clara, CA (US)

( * ) Notice: Subject to any disclaimer, the term of this patent is extended or adjusted under 35 U.S.C. 154(b) by 344 days.

(21) Appl. No.: 10/244,121

(22) Filed: Sep. 13, 2002

(65) Prior Publication Data

US 2004/0054956 A1 Mar. 18, 2004

(51) Int. Cl.
*H03M 13/00* (2006.01)
(52) U.S. Cl. ...................... 714/758; 714/799
(58) Field of Classification Search ............... 714/801, 714/755, 858, 761, 723, 805, 758, 799; 370/412; 713/150
See application file for complete search history.

(56) References Cited

U.S. PATENT DOCUMENTS

| 4,433,388 A | | 2/1984 | Oosterbaan |
| 4,949,342 A | * | 8/1990 | Shimbo et al. ............. 714/769 |
| 5,020,060 A | | 5/1991 | Murai et al. |
| 5,177,747 A | * | 1/1993 | Capps et al. ................ 714/805 |
| 5,303,302 A | * | 4/1994 | Burrows ...................... 713/161 |
| 5,537,421 A | * | 7/1996 | Dujari et al. ............... 714/785 |
| 5,606,662 A | * | 2/1997 | Wisor .......................... 714/48 |
| 6,374,383 B1 | | 4/2002 | Weng |
| 6,704,838 B1 | | 3/2004 | Anderson |
| 6,738,947 B1 | | 5/2004 | Maeda |
| 6,766,493 B1 | | 7/2004 | Hoffman et al. |
| 6,779,150 B1 | * | 8/2004 | Walton et al. ............... 714/763 |

OTHER PUBLICATIONS

Wicker, Stephen B. Error Control Ststems for Digital Communication and Storage, Prentice Hall, pp. 100-123.*

J. Zweig, et al., "TCP Altenate Checksum Options," Mar. 1990, 5 pages.

Craig Partridge, et al., "Performance of Checksums and CRCs over Real Data," 1995 ACM, pp. 68-76.

Jonathan Stone, et al., Performance of Checksums and CRC's over Real Data, 1998 IEEE, ACM Transaction on Networking, vol. 6, No. 5, pp. 529-543.

Anh Vu, "Error Detection and Error Correction," Oct. 27, 1997, 7 pages.

Anastase Nakassis, "Fletcher's Error Detection Algorithm: How to Implement it Efficiently and How to Avoid the Most Common Pitfalls," ACM SIGCOMM Computer Communication Review, vol. 18, Issue 5, Oct. 1998, pp. 63-88.

(Continued)

*Primary Examiner*—Guy Lamarre
*Assistant Examiner*—Mujtaba K. Chaudry
(74) *Attorney, Agent, or Firm*—Robert C. Kowert; Meyertons, Hood, Kivlin, Kowert & Goetzel, P.C.

(57) ABSTRACT

The present invention permits error detection to be performed on a word basis (e.g., 32 bits in parallel). An exclusive OR function is performed on each bit of data and cyclic redundancy code (CRC) bit in parallel. If a feedback value (e.g., a standard poly divider) is a logical one it is also included in the exclusive OR function. The present invention is readily adaptable for use with a variety of CRC polynomials (e.g., any Galois Finited Field Equation with primitive irreducible polynomials over GF(2) with linearly independent roots and the reciprocal polynomial with linearly independent roots. In one embodiment, each data word is effectively multiplied by alpha to the first power, where alpha is a root solution to the applicable polynomial utilized to calculate the CRC. In one exemplary implementation of the present invention, the instructions are in assembly language configured with a machine instruction shift through carry.

20 Claims, 4 Drawing Sheets

OTHER PUBLICATIONS

Anarchriz, "CRC and How to Reverse it: A CRC Tutorial & The c001 Way to Reverse CRC," Apr. 1999, 14 pages.
"Cyclic Redundancy Check," Aug. 2, 1997, 1 pages.
Eric Smith, "Memory Error Detection and Correction: An Introduction to Parity and ECC," Aug. 23, 1996, 2 pages.
Timothy Hsu, "How to Select System Memory," Jan. 9, 1999, 13 pages.
"Memory Tutorial," 1998, 3 pages.
Satran, Sheinwald Informational, "iSCSI CRC Considerations," May 7, 2001, 18 pages.
"A Short Spiel on 1-Bit Error Correction Codes," printed Aug. 11, 2001, 2 pages.
Rick Kelly, "Error Management Using DesignWare CRC and ECC," 2001 Synopsys, Inc., 5 pages.
ZDNet UK, "Parity RAM and ECC," PC Magazine Guide to Servers, 1999, 1 page.
"Before you start—Chapter 6: Break and Verify," © Laurence Soucy 1997/2001, 1 page.
"A Painless Guide to CRC Error Detection Algorithms," Version 3.00, Sep. 24, 1996, 19 pages.

* cited by examiner

ACCELERATED GALOIS DATA INTEGRITY CROSSCHECK SYSTEM AND METHOD

FIELD OF THE INVENTION

This invention relates to the field of information error correction. More particularly, embodiments of the present invention relate to systems and methods for data checking.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Realizing these advantageous results frequently requires systems to manipulate very large amounts of information. The information is often communicated between devices and errors sometimes occur in the communication of information to and from the devices. These errors often have detrimental impacts on the operations and functionality of the computer system.

Errors in the communication of information often causes system crashes. For example, traditional auxiliary physical storage systems typically cannot tolerate memory error faults and the memory error faults usually have significant detrimental impacts on functionality and utility of a system. Traditional information errors often result in crashes or terminations that impede smooth operation continuity. For example, in traditional auxiliary physical storage systems the approach to memory errors is to reboot the system. Rebooting from a system crash due to a memory error is very inconvenient, usually results in wasting significant resources and significantly increasing the probability of data corruption. Traditional memory error failure modes often result in lost information and delays incurred during the reboot process waste time.

Traditional error detection systems and methods are typically either very complex or have very limited memory error detection capabilities (such as parity checking). Attempts at providing more robust error detection typically involve very complicated algorithms and/or convoluted information manipulation to detect an error. The traditional error detection systems and methods also typically perform a byte-wise calculation of an error detection code which consumes significant processing resources. Other traditional systems that attempt to provide greater granularity in the error detection, the information is broken out by software one bit at a time and each bit is individually strobed into a register. Some systems may attempt to grab 32 bits of information at the same time and multiplying each byte by 32 which in the end consumes essentially the same resources as breaking the information up and strobing it in one bit at a time.

What is required is a system and method that provides a fine granularity to error detection utilizing minimal resources.

SUMMARY

The present invention is a error management system and method that facilitates convenient error detection with minimal resource consumption in a manner that permits smooth and continuous operations. A present invention computer memory error management system and method corrects memory errors and handles memory control buffer corruption concerns. The present invention permits error detection to be performed on a word basis (e.g., 32 bits in parallel). An exclusive OR and shift function is performed on each bit of data and cyclic redundancy code (CRC) bit in parallel. If a feedback value (e.g., a standard poly divider) is a logical one it is also included in the exclusive OR function. The present invention is readily adaptable for use with a variety of CRC polynomials (e.g., any Galois Finited Field Equation with primitive irreducible polynomials over GF(2) with linearly independent roots and the reciprocal polynomial with linearly independent roots. In one embodiment, each data word is effectively multiplied by alpha to the first power, where alpha is a root solution to the applicable polynomial utilized to calculate the CRC. In one exemplary implementation of the present invention, the instructions are in assembly language configured with a machine instruction shift through carry.

DETAILED DESCRIPTION

Reference will now be made in detail to the preferred embodiments of the invention, a computer memory error management system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within an electronic system. These descriptions and representations are the means used by those skilled in the digital arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in the electronic system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise or as apparent from the following discussions, it is appreciated that throughout the present invention, discussions utilizing terms such as "processing", "computing", "calculating", "determining", "displaying", or the like, refer to the action and processes of an electronic device that manipulates and transforms data represented as physical (electronic) quantities within the system (e.g., within registers, logic gates, memories, etc.) into other data similarly represented as physical quantities within the system devices or other such information storage, transmission or display devices.

Figure 1A:
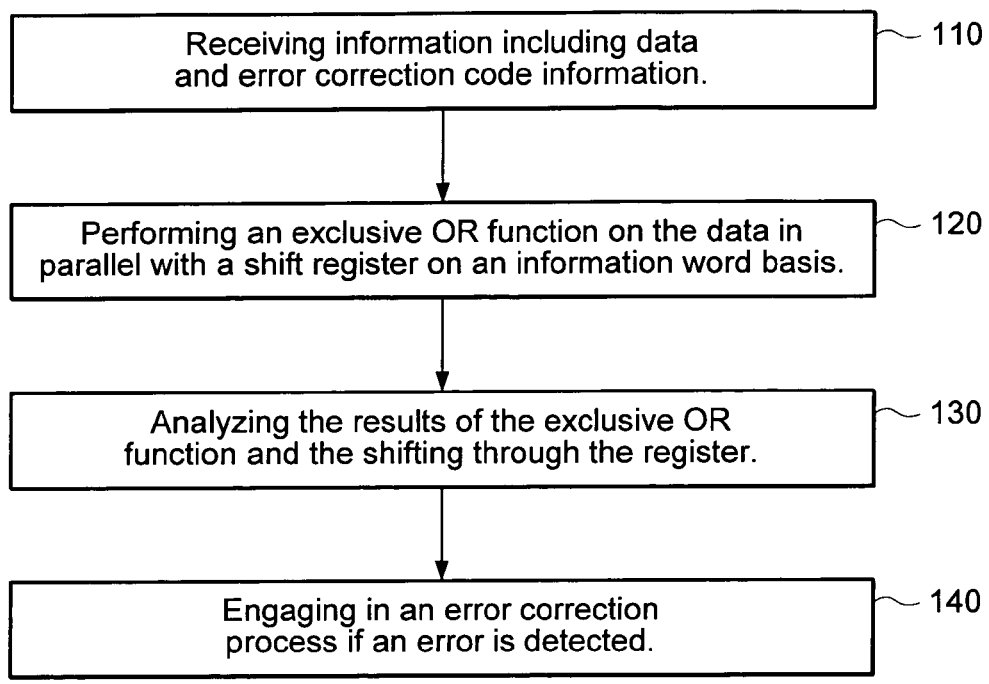
FIG. 1A is a flow chart of a memory error management method, one embodiment of the present invention.

FIG. 1A is a flow chart of data error correction method 100, one embodiment of the present invention. Data error correction method 100 facilitates error correction of data. In one embodiment of the present invention, data error correction method 100 utilizes a Galois Finite Field Equation with primitive irreducible polynomials over FG(2) with linearly independent roots and the reciprocal polynomial with linearly independent roots. In one exemplary disk array memory system implementation of the present invention, data error correction method 100 enables management of disk array controller cache memory errors.

In step 110, data and error correction code information is received. For example, a data block with a cyclic redundancy code (CRC) value attached to the end is received. In one embodiment of the present invention, an error correction code (ECC) capable memory receives the data and error correction code. In one exemplary implementation of the present invention, the information is a plurality of bits (e.g., electrical signals representing logical ones and zeroes) received by a memory controller buffer location (e.g., a cell of a memory controller cache of a disk array memory system). The present invention is readily adaptable to a variety of implementations, including receiving the data and error correction code information in a communication system. It is also compatible with information in different configurations, for example a memory controller buffer location may include a word comprising four bytes (32 bits) of information, two bytes (16 bits), eight bytes (64 bits), etc.

At step 120, an exclusive OR function is performed on the data in parallel with the error correction code information on a word basis. In one embodiment, each bit of the error correction code is shifted though a register as an exclusive OR function is performed with the a data bit. In one embodiment of the present invention, a CRC value is shifted into a register after exclusive ORing it with a single data bit of a 32 bit word. In one exemplary implementation, a feedback value is included in the exclusive OR function whenever the most significant bit of the CRC value is a logical one value.

In step 130, the results of the exclusive OR function on the data and error correction code information are analyzed to determine if an error exists. For example, if a CRC value calculated in step 120 does not equal zero then a determination is made that an error exists. In another embodiment of the present invention, an algorithm compares the error to a table that maps correctable errors (e.g., single bit error and select multi-bit errors). If the error is a correctable error the process proceeds to step 140.

An error correction process is engaged in step 140. The error correction process corrects the errors inline as the information is accessed (e.g., during the data's transfer return to a PCI bus). In one embodiment of the present invention, an exclusive OR (XOR) array technique is utilized to correct an error.

Figure 1B:
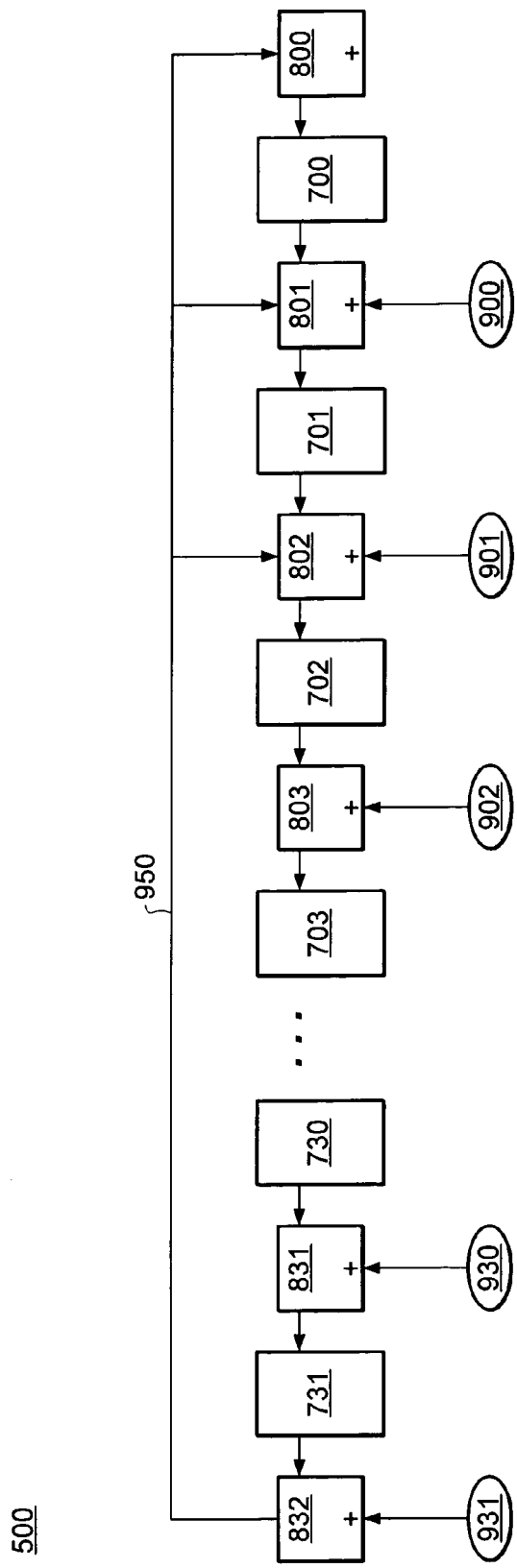
FIG. 1B is a block diagram of an error detection system in accordance with one embodiment of the present invention.

FIG. 1B is a block diagram of error detection system 500, one embodiment of the present invention. Error detection system 500 is one exemplary a hardware circuit implementation of the present invention. Error detection system 500 provides relatively fast and convenient calculation of a CRC value. Error detection system 500 comprises registers 700 through 731, exclusive OR gates 800 through 832, feedback loop 950 (e.g., 0X04C11DB7) and data inputs 900 though 931. Registers 700 through 731 and exclusive OR gates 800 through 832 are alternately coupled so that the input and output of each exclusive OR gate 800 through 832 coupled to a registers 700 through 731 respectively except the output of exclusive OR gate 832 is coupled to the input of exclusive OR gate 800. Each data input 900 though 931 is coupled to an input of exclusive OR gate 801 through 832 respectively and feedback values of a logical one are feed into the corresponding exclusive OR gate. For example, if the least significant portion of the feedback is a hexi-decimal 7 (0111 binary) then exclusive OR gates 800 though 802 have a feedback and exclusive Or gate 803 does not.

Figure 2:
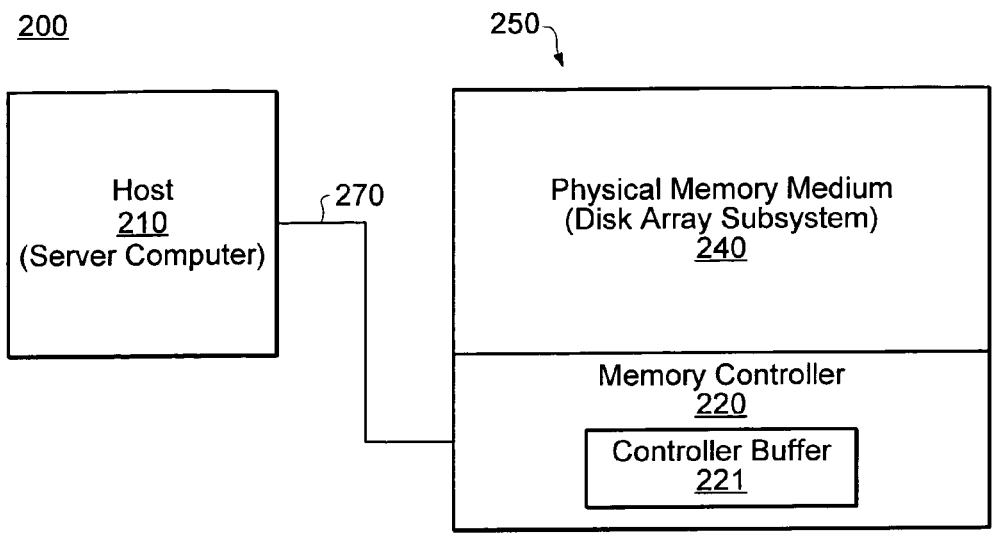
FIG. 2 is a block diagram illustration of a memory error management computer system, one exemplary system for implementing methods of the present invention.

FIG. 2 is a block diagram illustration of memory error management computer system 200, one exemplary system for implementing methods of the present invention. Memory error management computer system 200 comprises a host 210 and a memory device 250. The one embodiment of the present invention memory device 250 is a peripheral or an auxiliary memory device (e.g., a disk array storage system). Memory device 250 includes physical memory medium 240 (e.g., a disk array subsystem), and memory controller 220. Memory controller 220 includes memory controller buffers 221. In one embodiment of the present invention, memory controller buffer 221 is a cache. Host 210 is coupled to memory controller 220 via an interconnect 270, and memory controller 220 is coupled to physical memory medium 240. In one exemplary implementation of the present invention, host 210 is a server computer system that provides access and services to other computers (not shown).

The components of memory error management computer system 200, cooperatively operate to store, communicate and process information while efficiently managing memory errors that occur during the communication of information. Host 210 executes processing operations that provide and receive information to and from memory device 250. Memory storage device 250 stores information while providing error detection management. Information communicated between host 210 and memory storage device 250 is routed via memory controller 220. For example, memory controller 220 provides an information communication interface that handles memory error detection and memory error correction of correctable errors (e.g., single bit errors).

Referring still to FIG. 2, information communicated between physical memory medium 240 and host server computer system 210 is routed via controller buffer 221. In one exemplary implementation, overall memory input/output (I/O) operations involve host 210 writing and reading information to and from the physical memory medium 240. In order to perform the overall input/output operations information is sent (e.g., written) to and received (e.g., read)

from the control buffer 221. Memory error management is performed when communicating (e.g., reading) the information from the controller buffer 221 to either the host 210 or the physical memory medium 240.

Figure 3:
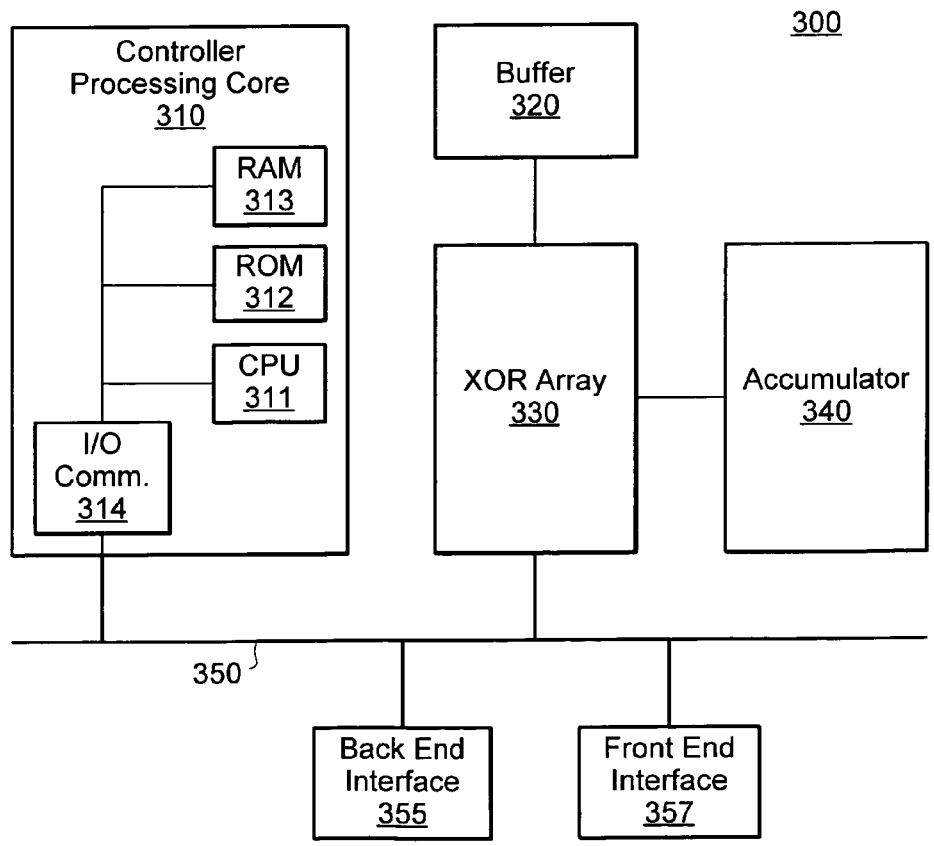
FIG. 3 is a block diagram of one embodiment of a present invention memory controller.

FIG. 3 is a block diagram of memory controller 300 one embodiment of a present invention memory controller (e.g., memory controller 221). Memory controller 300 comprises controller processing core 310, controller buffer 320, XOR array 330, accumulator 340, backend interface 355, front end interface 357 and communication bus 350. Communication bus 350 is coupled to controller processing core 310, backend interface 355, front end interface 357 and XOR array 330 which is coupled to controller buffer 320 and accumulator 340. In one exemplary implementation of the present invention, controller processing core 310 comprises central processing unit (CPU) 311 for processing memory controller instructions, a non-volatile memory 312 (e.g., a read only memory ROM) for storing static information for CPU 311, volatile memory 313 (e.g., a random access memory RAM) for storing information for CPU 311, input and output (I/O) communication interface 314 (e.g., a peripheral component interconnect (PCI) bridge) communicates information and address data bus 315 for communicating information between components within controller processing core 310.

The components of memory controller 300 cooperatively operate to facilitate fault tolerant memory error management. Controller processing core 310 directs the operations of memory controller 300. In one embodiment of the present invention, controller processing core 310 is utilized as a platform to implement present invention memory error management processes (e.g., a memory cell error resolution process of step 150). Buffer 320 stores information being communicated by memory controller 300 (e.g., between a host and physical memory medium). Logical exclusive or (XOR) array 330 provides correction of single bit errors. The correction is performed inline as the data is process through direct memory access (DMA) to a front end or back end interface. Accumulator 340 stores information associated with the logic and arithmetic operations of the XOR array. Back end interface provides a communications interface to back end devices (e.g., a memory storage medium). Front end interface provides a communications interface to front end devices (e.g., a host). Communication bus 350 communicates information between the components of memory controller 300.

Figure 4:
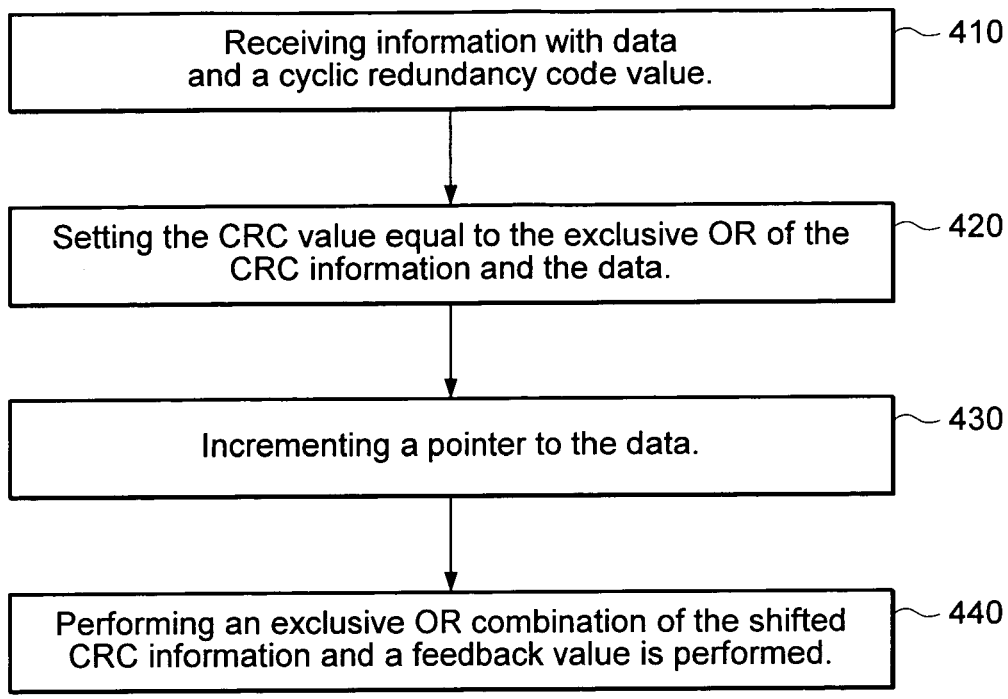
FIG. 4 is a flow chart of a cyclic redundancy code process in accordance with one embodiment of the present invention.

FIG. 4 is a flow chart of cyclic redundancy code process 400. In one embodiment the instructions of cyclic redundancy code process 400 are stored on a computer readable medium that when loaded in a processor cause the processor to perform a cyclic redundancy code process. In one embodiment of the present invention, memory cell error resolution process prevents corrupted information in a memory controller buffer from causing synchronization and incoherency problems between a host and a physical memory storage medium.

In step 410 information is received with data and cyclic redundancy code (CRC) value. In one exemplary implementation, the information includes a 32 bit word. The CRC value is set equal to the exclusive OR of the CRC information and the data in step 420. For example, setting the CRC value equal to the exclusive OR of the CRC information and the data is performed on a 32 bit word basis. At step 430 a pointer to the data is incremented. In step 430 a shift of the CRC value is performed. The shift may be performed in a variety of ways including multiplying the CRC value info by two or adding the CRC value to itself. At step 440 an exclusive OR combination of the shifted CRC information and a feedback value is performed.

The instructions for cyclic redundancy code process 400 can be encoded in a variety of software languages. In one exemplary implementation C programming language is utilized. For example:

```
crc = crc ^ *data++;              // one clock cycle for 4 bytes
if (crc & 0x80000000);            // two clock cycles for test
    crc = (crc + crc) ^ 0x04c11db7;   //two clock cycle (1 bit shift, xor)
else
    crc = crc+crc;
```

In one exemplary implementation the instructions are in assembly language configured with a machine instruction shift through carry. The present invention CRC calculation can be represented mathematically by the following formula:

$$Rx = [\alpha^1 * D(x)] \text{MOD}(X + \alpha^1).$$

Where $\alpha^1$ is alpha to the power of 1 and alpha is defined as the solution to the finite field polynomial equal to zero. The function $D(x)$ represents the data equation with coefficients of the powers of $\alpha^n$ from the finite field polynomial.

Thus, the present invention facilitates correction and resolution of errors that have detrimental impacts on the operations and functionality of systems utilizing error checking and correction memories. A present invention error detection system and method facilitates convenient and efficient error correction. The present invention system and method is compatible with CRC that ensures high level of randomness in it cyclic characteristics. The CRC can be calculated rapidly on a word basis with minimal consumption of clock cycles for each word.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A data error correction method, comprising:
   receiving data and error correction code information;
   performing an exclusive OR function of data in parallel with the error correction code information on a word basis, wherein said exclusive OR function provides a result equivalent to multiplying each word of said data by a root solution of a Galois finite field polynomial equation;
   analyzing the results of the exclusive OR function to determine if an error exists; and
   engaging in an error correction process.

2. The data error correction method of claim 1 wherein said data and error correction code information is stored as a plurality of bits in a memory controller buffer cell.

3. The data error correction method of claim 1 wherein said data and error correction code information is stored in a memory controller buffer of a disk array memory system.

4. The data error correction method of claim 1 wherein said word basis is a 32 bit word basis.

5. The data error correction method of claim 1 wherein performing said exclusive OR function of data in parallel with the error correction code information includes a feedback includes a standard 32 bit divider value.

6. The data error correction method of claim 5, wherein said standard 32-bit divider value represents the hexadecimal value 0x04C11DB7.

7. The data error correction method of claim 1 said error correction process includes rewriting information to a memory control buffer location.

8. An information communication controller, comprising:
a communication bus for communicating information between components of said information communication controller;
a controller processing core for directing operations of said information communication controller and providing a platform to implement data error correction process in which a cyclic redundancy code is determined by generating solutions for a Galois Finite Field polynomial equation, said controller processing core coupled to said communication bus;
an XOR array for detecting and correcting bit errors on an information word basis by exclusive oring data in parallel with a shift register, said XOR array coupled to said communication bus;
a buffer for storing information being communicated by said information communication controller between a host and a physical memory medium, said controller buffer coupled to said XOR array; and
an interface port for conveying information to or from another device, said interface port coupled to said communication bus.

9. The information communication controller of claim 8 wherein an error is detected at a location within a memory controller buffer and said controller processing core directs rewriting information to said location and rechecking for an error in said location.

10. The information communication controller of claim 9 wherein said controller processing core directs a reread of information from a physical memory medium and the reread information is utilized in said rewrite to said location.

11. The information communication controller of claim 9 wherein said controller processing core fences off said location and rewrites said information to a different location within said memory controller buffer.

12. The information communication controller of claim 9 wherein exclusive oring is performed on a word basis.

13. The information communication controller of claim 9 further comprising an accumulator for storing information associated with the logic and arithmetic operations of said XOR array, said accumulator coupled to said XOR array.

14. The information communication controller of claim 9 wherein said controller processing core directs tracking of error information.

15. A computer readable medium storing instructions configured to cause a processor to perform a cyclic redundancy code process, said instructions configured to implement:
receiving information including a data value and a cyclic redundancy code (CRC) value;
setting the CRC value equal to the exclusive OR of the CRC value and the data value; incrementing a pointer to the data value;
performing a shift of the CRC value subsequent to setting the CRC value equal to the exclusive OR of the CRC value and the data value; and
performing an exclusive OR combination of the shifted CRC value and a feedback value to produce an updated CRC value;
analyzing the updated CRC value to determine if an error exists; and
engaging in an error correction process if the error exists.

16. The computer readable medium of claim 15 wherein said shift is performed by multiplying said CRC value info by two.

17. The computer readable medium of claim 15 wherein said shift is performed by adding said CRC value to itself.

18. The computer readable medium of claim 15 wherein said data value includes a 32 bit word.

19. The computer readable medium of claim 15 wherein said setting the CRC value equal to the exclusive OR of the CRC information and the data is performed on a 32 bit word basis.

20. The computer readable medium of claim 15 wherein said instructions are in assembly language configured with a machine instruction shift through carry.

* * * * *